United States Patent [19]

Oehler et al.

[11] 4,183,134
[45] Jan. 15, 1980

[54] HIGH YIELD PROCESSING FOR SILICON-ON-SAPPHIRE CMOS INTEGRATED CIRCUITS

[75] Inventors: Harry G. Oehler, Glen Burnie; David S. Herman, Columbia; James R. Cricchi, Catonsville, all of Md.

[73] Assignee: Westinghouse Electric Corp., Pittsburgh, Pa.

[21] Appl. No.: 968,529

[22] Filed: Dec. 11, 1978

Related U.S. Application Data

[63] Continuation of Ser. No. 769,138, Feb. 15, 1977, abandoned.

[51] Int. Cl.² .................... H01L 21/22; H01L 21/26
[52] U.S. Cl. .................................. 29/571; 148/1.5; 148/187; 148/188; 357/42
[58] Field of Search ................ 148/1.5, 187, 188; 29/571, 577 R; 357/42

[56] References Cited

U.S. PATENT DOCUMENTS

| | | | |
|---|---|---|---|
| 3,442,011 | 5/1969 | Strieter | 29/578 |
| 3,566,518 | 3/1971 | Brown et al. | 29/571 |
| 3,657,613 | 4/1972 | Brody et al. | 357/23 |
| 3,745,072 | 7/1973 | Scott | 148/175 |
| 3,837,071 | 9/1974 | Ronen | 29/571 |
| 3,865,653 | 2/1975 | Goser | 148/187 |
| 3,909,307 | 8/1975 | Stein | 148/1.5 |
| 4,023,195 | 5/1977 | Richman | 357/23 |

OTHER PUBLICATIONS

Dataquest Inc., "Silicon on Sapphire", Palo Alto, Calif., Feb. 21, 1975, pp. 37–59.

Primary Examiner—G. Ozaki
Attorney, Agent, or Firm—R. M. Trepp

[57] ABSTRACT

Described herein a technique for constructing a complementary MOS device on a sapphire substrate so that the surface of the device is planarized, the P-channel and N-channel devices are in substantially correct registration, the threshold voltage for the back-channel leakage effect inherent in sapphire substrate device to occur is increased, and the areas of gate oxidation are pseudo self-aligned so as to minimize overlap of the gate oxide with the source and drain regions.

11 Claims, 17 Drawing Figures

HIGH YIELD PROCESSING FOR SILICON-ON-SAPPHIRE CMOS INTEGRATED CIRCUITS

This is a continuation of application Ser. No. 769,138, filed Feb. 15, 1977, now abandoned.

BACKGROUND OF THE INVENTION

1. Field of the Invention

This invention relates to semiconductor devices and processes, and in particular to dielectrically isolated planarized SOS semiconductor devices and processes for constructing such devices.

2. Description of the Prior Art

With the advent of complementary metal-oxide-silicon devices (CMOS), it became clear that the construction of such devices on a bulk silicon substrate was undesirable since the P-channel and N-channel devices were electrically connected through the common silicon substrate. Construction of CMOS devices on a sapphire substrate, commonly referred to as silicon-on-sapphire (SOS), produces the desirable result of dielectrically isolating the P-channel and N-channel devices by means of the sapphire substrate. As a result of constructing the devices on a sapphire substrate, additional difficulties which affected yield have been encountered.

FIG. 1 is a schematic illustration of a CMOS device on a sapphire substrate as constructed using prior art processing. Silicon islands 50 with source regions 52, drain regions 54, and gate regions 55 are physically separated on a sapphire substrate 56. FIG. 2 is a cross-section through the line II-II of a portion of one of the silicon islands 50 through the gate region 55. A thin layer of silicon dioxide forms a gate oxide 58 which is sandwiched between silicon island 50 and the metal electrode 60. The gate oxide 58 and metal electrode 60 both extend over the step or corner 62 of the silicon island 50. While metal electrode 60 extends to the surface 64 of the sapphire substrate 56, the gate oxide 58 is typically incomplete at the surface 64 of the sapphire substrate 56 because of incomplete growth during oxidation. This incomplete growth frequently results in a small gap 66 in the gate oxide 58 at the surface 64 of the sapphire substrate 56 into which some metal from the metal electrode 60 may be deposited. This gap 66 results in a weak area in the gate oxide 58 through which an oxide breakdown resulting in a short circuit of the metal electrode 60 to the silicon island 50 frequently occurs. Furthermore, oxide breakdown at the step or corner 62 of the silicon island 50 is also enhanced because of high electric fields generated at the corner 62.

Construction of the device as illustrated in FIGS. 1 and 2 also results in additional difficulties in subsequent masking steps when it is necessary to focus on the surface of the silicon island 50 and the surface of the sapphire substrate 56. Because of depth of field limitations due to the height of the silicon island 50 above the surface of the sapphire substrate 56, it is difficult to focus the mask on both surfaces simultaneously, thereby resulting in resolution problems and possible distortion of desired shapes, and in particular, causing metalization shorts.

In the processing of complementary P-channel and N-channel devices or MOS transistors, it is desirable that the distance between the respective gate regions be as consistent as possible because the processing steps for forming the gate oxides are usually performed with a single mask. In the prior art, misregistration between the two gate regions frequently occurred, thereby resulting in excessive gate metal over the source or drain regions, which increases the overlap capacitance and decreases the speed at which the device may operate.

Radiation induced charge in the sapphire substrate significantly affects operation of the N-channel device. In a radiation environment, the sapphire acquires a positive charge which is located near the sapphire-silicon interface. The positive charge in the sapphire attracts a negative charge to the interface in the silicon, thereby creating a back channel for electron flow which is not controlled by the normal top surface gate. In the prior art, this back-channel leakage effect frequently occurs, thereby detrimentally affecting the operation of the N-channel device.

Critical in the construction of an MOS device is the overlap of the gate oxide over the source and drain regions. The prior art requires an oversized gate window to compensate for misalignment so as to assure that the thin gate region overlaps both the source and drain regions. This overlap results in a higher overlap capacitance, thereby decreasing the speed at which the device may operate.

It is therefore desirable to construct silicon islands on a sapphire substrate with devices therein which may be interconnected without traversing steps, corners and gaps at the silicon island edges.

It is desirable to have the surface of the silicon islands and the surfaces in between the silicon islands at the same height above the sapphire substrate to eliminate depth of field variations during masking steps.

It is desirable to prevent device gate metal from overlapping the source and drain regions which increases the gate capacitance due to misregistration between two device regions of different types or due to mask misalignment with one device region.

It is desirable to prevent back channel leakage in an N-channel device after charge has been induced in the supporting sapphire substrate due to ionizing radiation.

SUMMARY OF THE INVENTION

In accordance with the present invention, a process is disclosed for forming a semiconductor structure which includes isolated silicon islands on a sapphire substrate, the isolation being formed by silicon dioxide regions around the islands, and the silicon dioxide region having an upper surface approximately planar with the upper surface of the silicon islands and extending to the sapphire substrate. Such a structure will hereinafter be referred to as a planarized structure. The process steps include a technique whereby the N and P channel transistors are in substantially correct registration, thereby eliminating the need to compensate for previous mask misalignment in subsequent masking steps. Processing steps to reduce the back-channel leakage effect by implanting a high concentration of P dopant at the silicon-sapphire interface are disclosed. This reduces the effects of the positive charges generated by radiation. Process steps are included to construct a pseudo self-aligned gate oxide by using a silicon nitride layer, thereby minimizing the overlap capacitance and increasing the operating speed of the device.

DESCRIPTION OF THE PREFERRED EMBODIMENT

Figure 1:
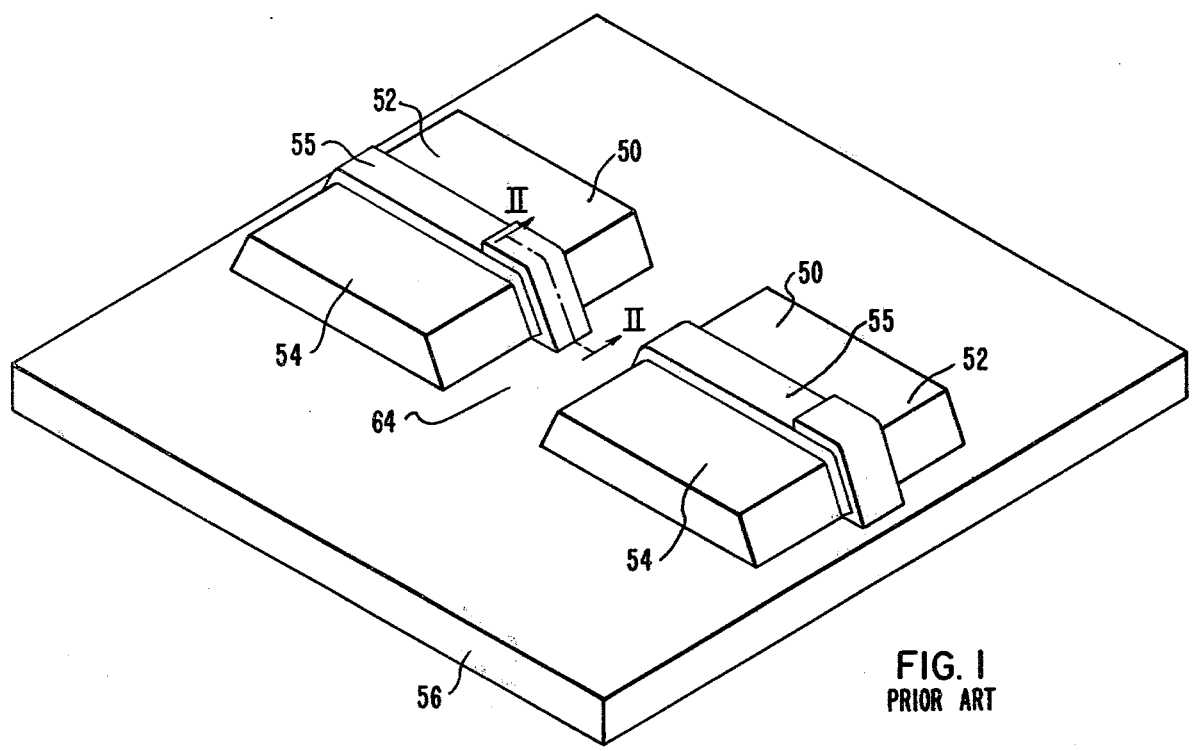
FIG. 1 is a simplified diagram of typical transistors used in prior art CMOS circuits.
Figure 2:
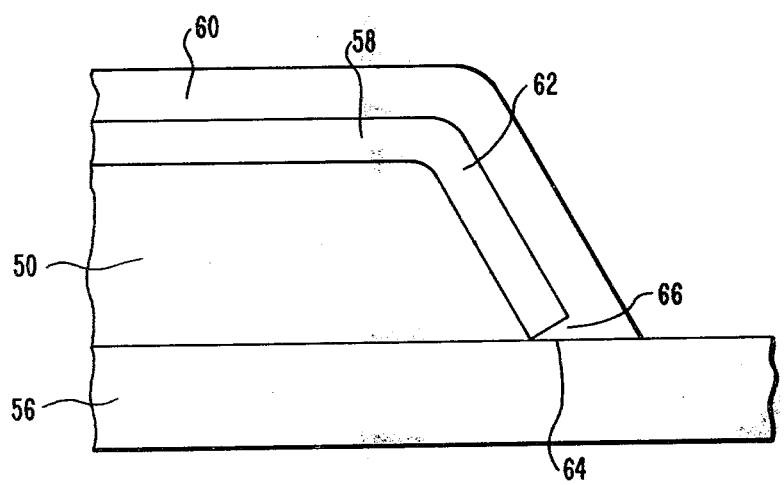
FIG. 2 is an expanded partial vertical cross-section through the line II—II of the gate structure of FIG. 1.
Figure 3:
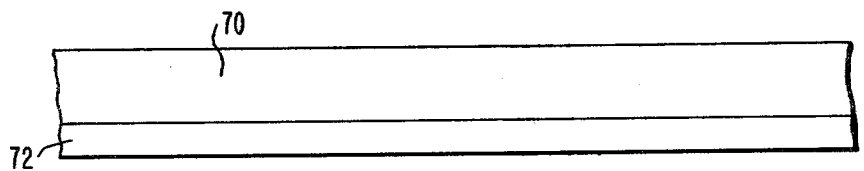
FIGS. 3 through 17 are vertical cross-sectional views illustrating structures resulting from a sequence of steps for producing a CMOS device on a sapphire substrate.
Figure 4:
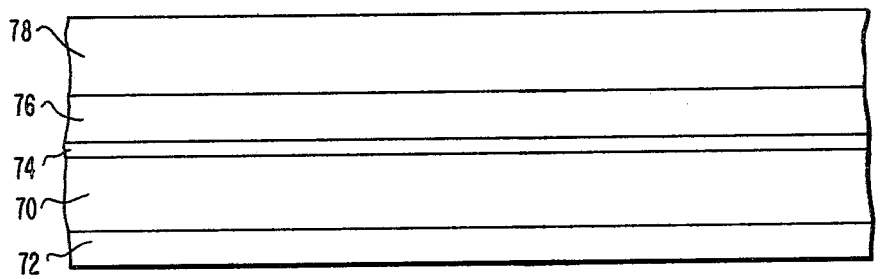

Oxide failure at the corner of the silicon island and short circuiting at the sapphire substrate which were common in the prior art can be reduced to increase yield by surrounding the silicon island with a dielectric insulator of nearly the same height above the sapphire substrate as the silicon island. This results in a substantially planar upper surface. FIGS. 3 through 7 illustrate structures resulting from process steps whereby such a structure is formed. FIG. 3 illustrates a layer of semiconducting material 70 deposited on a sapphire substrate 72. A typical semiconductor material 70 is silicon, lightly doped with N-type dopants with resistivity between 4 and 8 ohm-centimeters with a thickness between 0.1 $\mu$m and 1.5 $\mu$m. FIG. 4 illustrates the device after a thin silicon dioxide layer 74 of approximately 100 Angstroms has been grown on the silicon semiconductor 70. A silicon nitride layer 76 has been deposited on top of silicon dioxide layer 74. A thin silicon dioxide layer 74 serves to reduce surface stresses between the silicon layer 70 and the silicon nitride layer 76. This layer 74 may be eliminated if it is not desired to reduce these stresses. Deposited above the silicon nitride layer 76 is a silicon dioxide layer 78 of approximately 5000 Angstroms.

Figure 5:
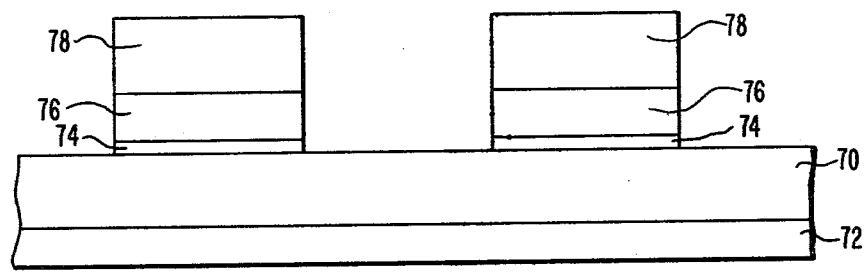

A photosensitive material, commonly referred to in the art as photoresist, is deposited on a structure as shown in FIG. 4, exposed through a mask, and developed using known techniques, so as to leave small exposed regions of silicon dioxide layer 78. Etchants known in the art are used to remove the exposed portions of the silicon dioxide layer 78 to the silicon nitride surface 76. After removing the photoresist layer, an etchant is used to remove the portions of the silicon nitride layer 76 which are not masked by the remaining portions of oxide layer 78. The resultant structure, illustrated in FIG. 5, is composed of small blocks which are stacked layers of a stress oxide layer 74, the remaining portions of silicon nitride layer 76, and the remaining portions of silicon dioxide masking layer 78. The silicon dioxide masking layer 78 is removed.

The silicon dioxide masking layer 78 described herein to provide a mask for etching silicon nitride layer 76 could be avoided by using other well-known photo procedures to provide the etched silicon nitride layer 76.

Figure 6:
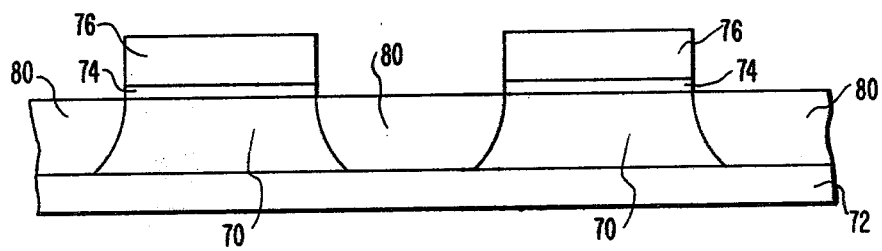

After removing the remaining portions of silicon dioxide masking layer 78, an oxidation step follows. This step converts all the silicon between the blocks formed by layers 74 and 76 to silicon dioxide. FIG. 6 illustrates the device after this oxidation step in which silicon islands 70 are dielectrically isolated by silicon dioxide regions 80. The device is planarized by growing the silicon dioxide layer such that the surface of the silicon dioxide region 80 is at approximately the same height above the sapphire substrate 72 as the silicon island 70. Because of the volume increase in converting the silicon to silicon dioxide using current technology, it is necessary to oxidize this region in two distinct oxidation steps: first, oxidize approximately half the silicon, strip the oxide, and second, oxidize the remaining silicon to the sapphire substrate. Alternatively, the exposed silicon regions could be thinned to approximately half their starting height. The subsequent oxidation of the remaining silicon will result in a silicon dioxide region of approximately the same height as the starting silicon.

Figure 7:
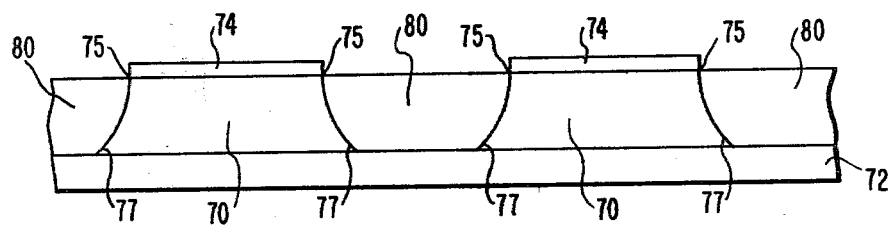

FIG. 7 illustrates a cross-section of the nearly planar surface after the silicon nitride layer 76 has been stripped. Because the surface of the silicon dioxide regions 80 is at approximately the same height above the sapphire substrate 72 as the silicon island 70, the high field configuration at the corner 75 of the silicon island 70 and the gap or interface 77 at the surface of sapphire substrate 72 will be reduced upon completion of the device because the gate oxide will be substantially planar with the surrounding insulating material. Furthermore, because of the near planarization of the surface of silicon island 70 with the surface of the silicon dioxide region 80, difficulties with focusing due to depth of field limitations during subsequent photomasking steps have been reduced.

Figure 8:
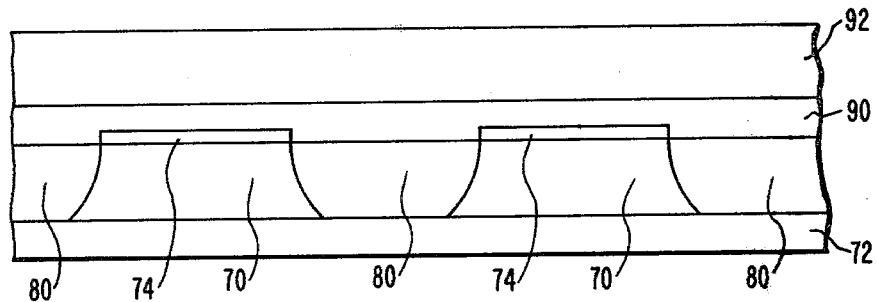
Figure 9:
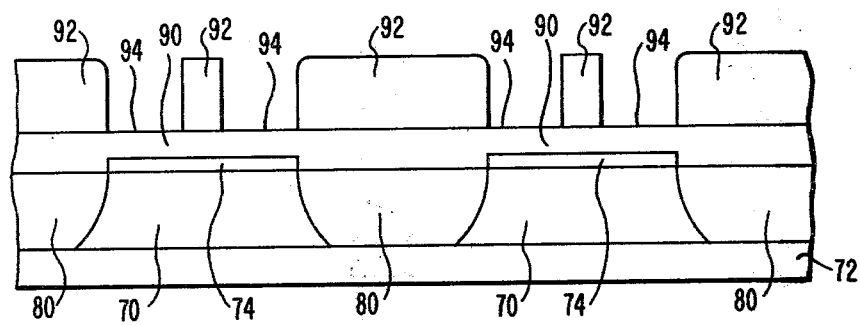

FIGS. 8 through 13 are diagrams illustrating structures resulting from process steps for obtaining substantially correct registration between the N-channel and P-channel transistors in a CMOS configuration by using self-aligned diffusions. Starting in FIG. 8 with the planarized configuration illustrated in FIG. 7, a silicon nitride layer 90 and silicon dioxide layer 92 are deposited over oxide layer 74 and silicon dioxide region 80 so as to create a layered structure as illustrated in FIG. 8. Using standard photomasking techniques known in the art, windows in the oxide layer 92 under which the source and drain regions will be constructed are etched open. FIG. 9 illustrates the resulting structure with etched windows 94.

Figure 10:
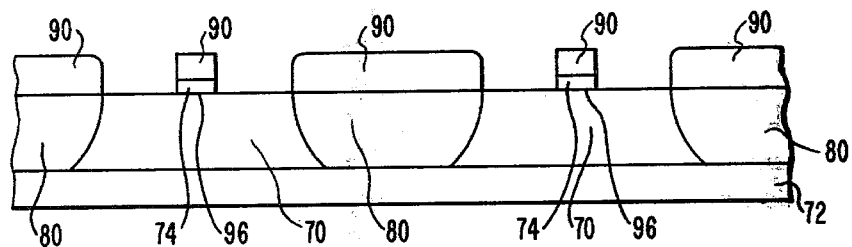

Portions of the silicon nitride layer 90 and oxide layer 74 are removed by etching so as to expose portions of the surface of silicon island 70. The remaining portions of silicon dioxide layer 92 are then removed. The silicon dioxide masking layer 92 described herein to provide a mask for etching silicon nitride layer 90 could be avoided by using other well-known photo procedures to provide the etched silicon nitride layer 90. FIG. 10 illustrates the resulting structure. Portions of silicon nitride layer 90 now remain over the electrically insulating silicon dioxide regions 80 as well as over oxide layer 74 and portions 96 of silicon islands 70. These remaining portions of silicon nitride layer 90 serve as masking layers for doping the source and drain regions of the N-channel and P-channel devices in silicon islands 70 resulting in substantially correct registration between the gate regions of the N-channel and P-channel devices.

Figure 11:
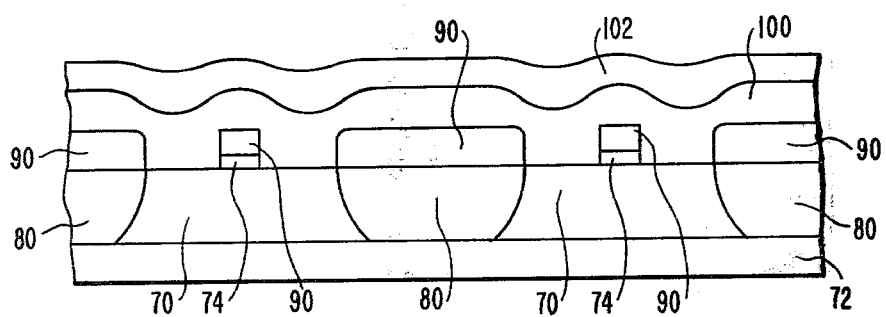
Figure 12:
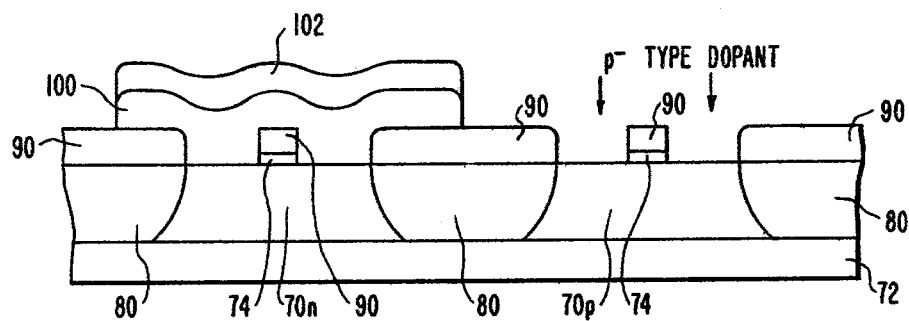
Figure 13:
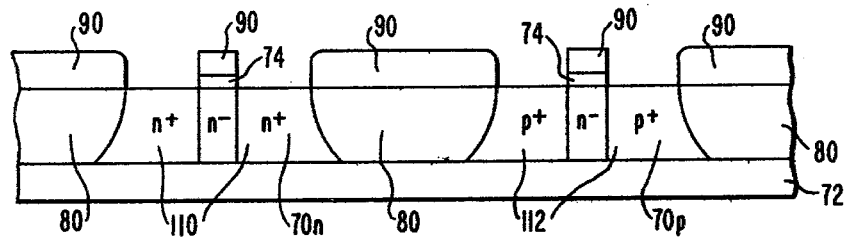

Doping of the source and drain regions of the N-channel and P-channel transistor devices may be accomplished by any one of several processes. Structures resulting from a preferred process are illustrated in FIGS. 11, 12 and 13. In FIG. 11, an N-doped silicon dioxide glass 100 of approximately 5000 Angstroms is deposited over the surface of the structure as illustrated in FIG. 10. Deposited on top of the N-doped silicon dioxide glass 100 is a silicon dioxide layer 102. Layer 102 serves as an out-diffusion cap on the N-doped silicon dioxide glass 100, thereby preventing out-diffusion of the N dopant during subsequent processing steps.

FIG. 12 illustrates the device after completing a standard photomasking and etching process to remove N- doped silicon dioxide glass 100 and silicon dioxide layer 102 where P-channel devices are desired. The N-doped silicon dioxide glass layer 100 and out-diffusion cap 102 remain over the N-channel silicon island 70n which will be the N-channel transistor. The photomasking process and etching has removed the N-doped silicon dioxide glass layer 100 and out-diffusion cap 102 from the P-channel silicon island 70p thereby exposing regions which will be the drain and source of the P-channel device.

The structure illustrated in FIG. 13 is constructed by performing a predeposition of P-type material such as boron, followed by a drive-in of the P dopant and the N dopant, and a removal of all deposition glasses using standard techniques known in the art. Those skilled in the art will appreciate that alternate techniques may be used to dope the source and drain regions.

The configuration illustrated in FIG. 13 results in substantially correct registration between the source and drain regions 110 of the N-channel device and the source and drain regions 112 of the P-channel device because of the self-aligned diffusions. Additionally the subsequent process steps, as described below do not require masking and oxide etching steps to form the gate insulator. This eliminates the need for an oversize gate as was required in the prior art. Eliminating the need for an oversize gate reduces the excess capacitance associated with the overlap of the gate with the drain and source, thereby improving the frequency response of the transistor.

Figure 14:
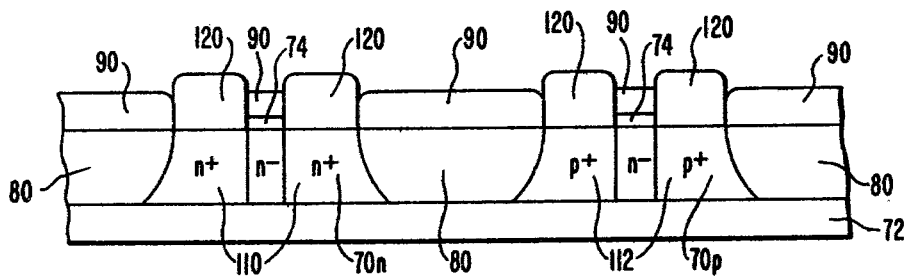

FIGS. 14, 15, 16 and 17 illustrate the remaining steps for completing the construction of a CMOS device on a sapphire substrate using the processes disclosed by this application. After achieving a structure as illustrated in FIG. 13, an oxidation step follows in which a thick field oxide 120 is grown over those portions which are not covered by silicon nitride layer 90 as shown in FIG. 14. Oxide growth occurs over the source and drain regions 110 of the N-channel device and source and drain regions 112 of the P-channel device. The effect of silicon nitride layer 90 on silicon islands 70n and 70p is to prevent the growth of silicon dioxide at those regions where the gate will be formed and permit the growth of a self-registered field oxide 120 around the gate region, thereby pseudo self-aligning the gate regions with the source and drain regions.

Figure 15:
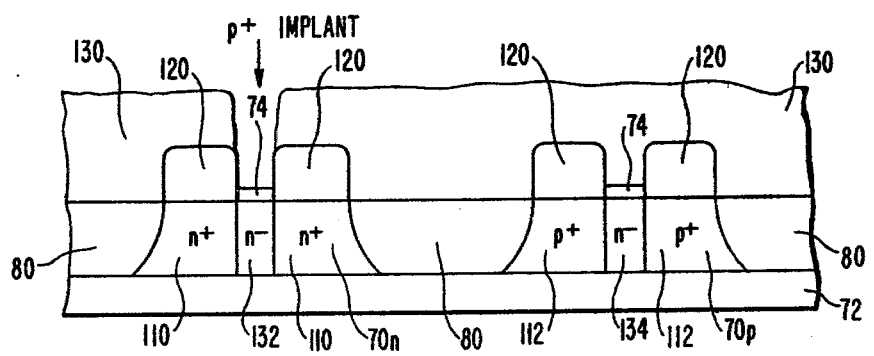

In order to decrease the problems associated with the back-channel leakage effect on the N-channel device, a concentration of positive charge is located in the silicon near the silicon-sapphire substrate. This is accomplished by first removing the remaining portions of the silicon nitride layer 90. A layer of photoresist 130, as illustrated in FIG. 15, is deposited, exposed, and developed so as to expose oxide layer 74 or the gate region 132 of the N-channel device and to mask gate region 134 of the P-channel device. An ion implantation of a P-type material, such as boron followed by annealing, is then performed so as to cause a concentration peak of the P dopant in the silicon substrate near the silicon-sapphire interface. The effect is to increase the amount of radiation-induced positive charge need in the sapphire substrate before a back channel of negative charge connecting the source and drain regions 110 is completed. Typical concentration values of the P dopant at the silicon sapphire interface are $5 \times 10^{17}$/cc while typical values at the silicon surface are $2 \times 10^{16}$/cc.

If desired, the threshold of the N-channel device may be altered by performing an additional ion implantation of P dopant near the surface of the silicon at gate region 132. Alternatively, the anneal cycle which activates the implanted material may be performed so as to result in some redistribution of the implanted P-material to the surface of the gate 132. However, such redistribution should be minimized so as to maintain the highest concentration possible near the silicon-sapphire interface of gate region 132.

Those skilled in the art will appreciate that in some processing schemes, it may be desirable to perform the ion implantation earlier in the sequence of processing steps. By depositing a layer of photoresist on a structure illustrated in FIG. 7, exposing the photoresist through a mask, and developing so as to expose the oxide layer 74 and silicon island 70 on which the N-channel MOS device will be constructed, the ion implantation may be performed earlier in the processing sequence with the subsequent high temperature processing acting as the anneal cycle.

Figure 16:
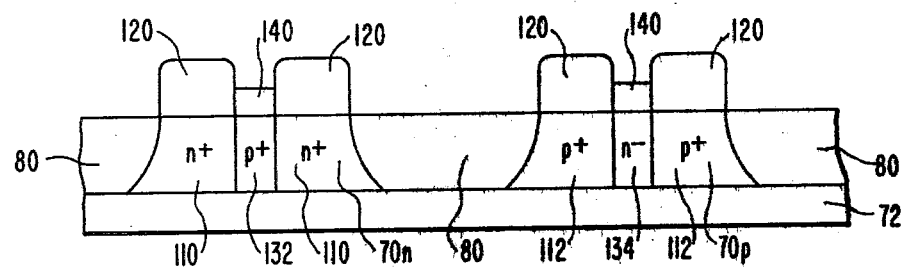

FIG. 16 illustrates the CMOS device after the 100 Angstrom stress oxide 74 has been etched, photoresist layer 130 has been removed, and an oxidation step in which gate oxide 140 is grown. Gate oxide 140 is pseudo self-aligned over P-region 132 and N-region 134 because self-registered field oxide regions 120 define gate regions 132 and 134.

Figure 17:
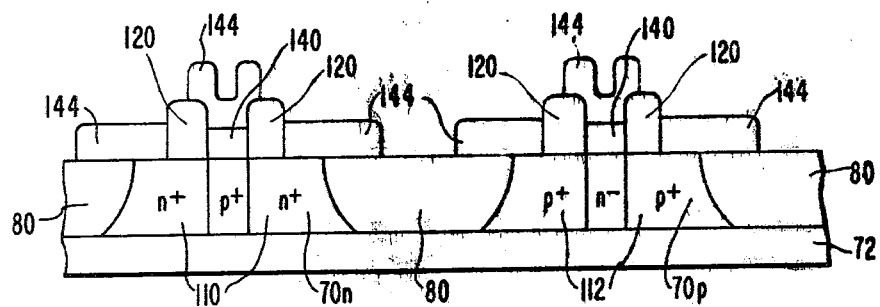

FIG. 17 illustrates the final form of the CMOS structure on the sapphire substrate 72. Standard processing steps are used to cut an opening to the source and drain regions 110 and 112 so as to allow the evaporation of metal into these regions and over gate oxide 140. A photomask and etch step follow so as to leave a metal contact 144 over source and drain regions 110 and 112 as well as over gate oxide 140. Typically, some overlap of metal layer 144 over field oxide 120 will result. However, the overlap capacitance due to this effect is minimized because of the thickness of the field oxide layer 120.

Those skilled in the art will appreciate that several of the processing steps enumerated above have broader application than to the construction of a CMOS device on a sapphire substrate. The configuration illustrated in FIG. 7 whereby the silicon islands 70 are dielectrically isolated by a silicon dioxide layer 80 has application to the construction of any silicon-on-sapphire device. The dielectric isolation of silicon islands and the nearly planar surface of the silicon and silicon oxide surfaces will reduce oxide failure at the silicon corner, improve metal step coverage, reduce focusing problems due to depth of field limitations, and reduce oxide failure at the gap at the silicon-sapphire-silicon dioxide interface for any MOS device constructed on a sapphire substrate.

Although the processing steps resulting in a structure as illustrated in FIG. 13 in which the source and drain regions 110 of the N-channel device are in substantially correct registration with the source and drain regions 112 of the P-channel device, are particularly applicable to the construction of CMOS devices on sapphire, the process described is applicable to any device in which alignment between mask levels is critical. Furthermore, those skilled in the art will appreciate that such steps are applicable to bulk silicon processing besides a silicon island structure on a sapphire substrate.

The process step for raising the threshold voltage before the back-channel leakage effect occurs by implanting a high concentration of P dopant near the silicon-sapphire interface is applicable to any N-channel MOS device constructed on a sapphire substrate.

Furthermore, the process steps enumerated for achieving a gate oxide which is self-aligned with respect to the source and drain regions are applicable to any N-channel or P-channel MOS structure as well as a CMOS configuration whether constructed on a sapphire substrate or bulk silicon.

Furthermore, those skilled in the art will appreciate that although the process steps discussed above use masking layers consisting of silicon dioxide, silicon nitride, and photoresist, other substances are usable.

We claim as our invention:

1. A method for fabricating a semiconductor device on a semiconductor substrate supported by an insulating sapphire substrate, comprising the steps of:

forming at least two silicon regions separated by an insulating region having a substantially planar upper surface;

forming a first masking structure such that the surface of said first silicon region is exposed at a first and second area and is masked at a third area and the surface of said second silicon region is exposed at a fourth and fifth area and is masked at a sixth area, doping said first and second areas of said first silicon region with a first conductivity;

doping said fourth and fifth areas of said second silicon region with a second conductivity;

oxidizing said first, second, fourth, and fifth areas of said first and second silicon regions to form a thick field oxide;

removing said first masking structure;

locating a concentration of dopant in the silicon substrate near the silicon-sapphire interface, beneath said third area of the first silicon region;

oxidizing said third and sixth areas of said first and second silicon regions to form an oxide;

forming metal connections to said first, second, fourth, and fifth areas; and forming a conductive layer overlaying the oxide covering said third and sixth areas.

2. A method for fabricating a semiconductor device on a semiconductor substrate supported by an insulating substrate, comprising the steps of:

forming at least two silicon regions separated by an insulating region having a substantially planar upper surface;

forming a first masking structure such that the surface of said first silicon region is exposed at a first and second area and is masked at a third area and the surface of said second silicon region is exposed at a fourth and fifth area and is masked at a sixth area;

doping said first and second areas of said first silicon region with a first conductivity;

doping said fourth and fifth areas of said second silicon region with a second conductivity;

oxidizing said first, second, fourth, and fifth areas of said first and second silicon regions to form a thick field oxide;

removing said first masking structure;

locating a concentration of dopant in the silicon substrate near the silicon-insulating substrate interface, beneath said third area of the first silicon region;

oxidizing said third and sixth areas of said first and second silicon regions to form an oxide;

forming metal connections to said first, second, fourth, and fifth areas; and forming a conductive layer overlaying the oxide covering said third and sixth area.

3. A method in accordance with claim 1 or 2 wherein said first and second areas are the source and drain, and said third area is the gate.

4. A method in accordance with claim 1 or 2 wherein said fourth and fifth areas are the source and drain and the sixth area is the gate.

5. A method in accordance with claim 1 or 2 wherein said step of forming at least two silicon regions separated by an insulating region includes the steps of:

oxidizing approximately half the depth of the silicon in said insulating region to form silicon dioxide, removing said silicon dioxide in said insulation region, and oxidizing the remaining silicon in said insulating region to form silicon dioxide in said insulating region whereby the surface of said insulating region is at approximately the same height above said insulating substrate as the height of said silicon regions.

6. A method in accordance with claim 1 or 2 wherein said step of forming at least two silicon regions separated by an insulating region includes the steps of:

thinning to approximately one half the depth of the silicon in said insulating region and oxidizing the remaining silicon in said insulating region to form silicon dioxide in said insulating region whereby the surface of said insulating region is at approximately the same height above said insulating substrate as the height of said silicon region.

7. A method for fabricating a semiconductor device on at least two spaced apart semiconductor regions supported by a dielectrically insulating sapphire substrate comprising the steps of:

forming a first masking layer on the surface of a silicon semiconductor layer on said substrate and a second masking layer on the surface of said first masking layer;

selectively removing portions of said second and first masking layers so as to expose portions of said semiconductor layer;

thermally oxidizing said exposed portions of said semiconductor layer, so as to form at least two spaced apart semiconductor regions;

forming a third masking layer;

forming a fourth masking layer on the surface of said third masking layer;

selectively removing portions of said third and fourth masking layers so as to expose first and second areas and to mask a third area on said first semiconductor region;

selectively removing portions of said third and fourth masking layers so as to expose a fourth and fifth area and to mask a sixth area on said second semiconductor region;

doping said first and second regions with a first conductivity;

doping said fourth and fifth regions with a second conductivity;

oxidizing said first, second, fourth, and fifth regions;

removing said fourth masking layer;

forming a fifth masking layer to mask an ion implantation, said fifth masking layer exposing said third area on said first semiconductor region and ion implanting a concentration of dopant in said first semiconductor region beneath said third area near the silicon-sapphire interface;

removing said fifth masking layer;

oxidizing said third and sixth areas to form an oxide;
forming metal connections with said first, second, fourth, and fifth areas; and
forming a conductive layer overlaying the oxide covering said third and sixth areas.

8. A method for obtaining substantially correct registration between two or more semiconductor devices on a semiconductor substrate comprising the steps of:
  forming a masking structure such that first and second areas on said semiconductor substrate are exposed, and a third area on said semiconductor substrate is masked;
  doping said first and second areas with a first conductivity;
  oxidizing said first and second areas on said semiconductor substrate to form an oxide over said first and second areas;
  removing said first masking structure;
  oxidizing said third area to form an oxide;
  forming metal connections to said first and second areas; and
  forming a conductive layer overlaying the oxide covering said third area.

9. A method for pseudo self-aligning the gate oxide of a semiconductor device so as to reduce the overlap of the gate oxide with the adjacent doped regions, comprising the steps of:
  forming a first masking structure on a semiconductor substrate which exposes a first and second area and masks a third area on said semiconductor substrate;
  growing a thick oxide at said first and second areas;
  removing said first masking structure;
  growing a gate oxide over said third area;
  forming metal connections to said first and second areas; and
  forming a conductive layer overlaying said oxide covering said third area.

10. A method in accordance with claim 9 wherein said first masking structure is silicon nitride.

11. A method for fabricating a semiconductor device on at least two spaced apart semiconductor regions supported by a dielectrically insulating substrate comprising the steps of:
  forming a first masking layer on the surface of a silicon semiconductor layer on said substrate and a second masking layer on the surface of said first masking layer;
  selectively removing portions of said second and first masking layers so as to expose portions of said semiconductor layer;
  thermally oxidizing said exposed portions of said semiconductor layer, so as to form at least two spaced apart semiconductor regions;
  forming a third masking layer;
  forming a fourth masking layer on the surface of said third masking layer;
  selectively removing portions of said third and fourth masking layers so as to expose first and second areas and to mask a third area on said first semiconductor region;
  selectively removing portions of said third and fourth masking layers so as to expose a fourth and fifth area and to mask a sixth area on said second semiconductor region;
  doping said first and second regions with a first conductivity;
  doping said fourth and fifth regions with a second conductivity;
  oxidizing said first, second, fourth, and fifth regions,
  removing said fourth masking layer;
  forming a fifth masking layer to mask an ion implantation, said fifth masking layer exposing said third area on said first semiconductor region and ion implanting a concentration of dopant in said first semiconductor region beneath said third area near the silicon-insulating substrate interface;
  removing said fifth masking layer;
  oxidizing said third and sixth areas to form an oxide;
  forming metal connections with said first, second, fourth, and fifth areas; and
  forming a conductive layer overlaying the oxide covering said third and sixth areas.

* * * * *